United States Patent
Anholt

(10) Patent No.: US 8,068,360 B2
(45) Date of Patent: Nov. 29, 2011

(54) READING ANALOG MEMORY CELLS USING BUILT-IN MULTI-THRESHOLD COMMANDS

(75) Inventor: Micha Anholt, Tel-Aviv (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 741 days.

(21) Appl. No.: 12/178,318

(22) Filed: Jul. 23, 2008

(65) Prior Publication Data

US 2009/0106485 A1    Apr. 23, 2009

Related U.S. Application Data

(60) Provisional application No. 60/981,113, filed on Oct. 19, 2007, provisional application No. 60/989,129, filed on Nov. 20, 2007.

(51) Int. Cl.
*G11C 16/04* (2006.01)

(52) U.S. Cl. ......... 365/185.03; 365/185.22; 365/185.21; 365/185.24; 365/185.28; 365/185.02

(58) Field of Classification Search ............. 365/185.03, 365/185.22, 185.21, 185.24, 185.28, 185.02
See application file for complete search history.

(56) References Cited

U.S. PATENT DOCUMENTS

| | | |
|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |

(Continued)

FOREIGN PATENT DOCUMENTS

EP    0783754 B1    7/1997

(Continued)

OTHER PUBLICATIONS

U.S. Appl. No. 11/995,814 Official Action dated Dec. 17, 2010.

(Continued)

*Primary Examiner* — Connie Yoha
(74) *Attorney, Agent, or Firm* — D. Kligler I.P. Services Ltd.

(57) ABSTRACT

A method for data storage includes storing data in a memory that includes multi-bit analog memory cells, each of which stores at least first and second data bits by assuming one of a predefined plurality of programming levels associated with respective storage values. The memory has at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number. After storing the data, the first data bits are read from the memory cells by executing at least the second built-in command.

26 Claims, 7 Drawing Sheets

U.S. PATENT DOCUMENTS

| | | |
|---|---|---|
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,969,986 A | 10/1999 | Wong et al. |
| 5,991,517 A | 11/1999 | Harari et al. |
| 5,995,417 A | 11/1999 | Chen et al. |
| 6,009,014 A | 12/1999 | Hollmer et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,166,962 A | 12/2000 | Chen et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,275,419 B1 | 8/2001 | Guterman et al. |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,396,742 B1 | 5/2002 | Korsh et al. |
| 6,397,364 B1 | 5/2002 | Barkan |
| 6,405,323 B1 | 6/2002 | Lin et al. |
| 6,418,060 B1 | 7/2002 | Yong et al. |
| 6,442,585 B1 | 8/2002 | Dean et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,558,967 B1 | 5/2003 | Wong |
| 6,560,152 B1 | 5/2003 | Cernea |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |
| 6,807,095 B2 | 10/2004 | Chen et al. |
| 6,809,964 B2 | 10/2004 | Moschopoulos et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,894,926 B2 | 5/2005 | Guterman et al. |
| 6,907,497 B2 | 6/2005 | Hosono et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 7,002,843 B2 | 2/2006 | Guterman et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |

| Patent No. | Date | Name |
|---|---|---|
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 * | 12/2008 | Kang et al. ............ 365/185.03 |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim et al. |
| 7,596,707 B1 | 9/2009 | Vemula |
| 7,631,245 B2 | 12/2009 | Lasser |
| 7,633,798 B2 | 12/2009 | Sarin et al. |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 | 12/2010 | Gonzalez et al. |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |

| | | |
|---|---|---|
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0270730 A1 | 10/2008 | Lasser et al. |
| 2008/0282106 A1 | 11/2008 | Shalvi et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169743 A1 | 7/2010 | Vogan et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132458 A2 | 11/2007 |
| WO | WO-2007132457 | 11/2007 |
| WO | 2007146010 A2 | 12/2007 |
| WO | 2008026203 A2 | 3/2008 |
| WO | 2008053473 A2 | 5/2008 |
| WO | WO-2008053472 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

Ubuntu Forums, "Memory Stick Failed IO Superblock", posted Nov. 11, 2009.

Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.
U.S. Appl. No. 13/021,754 "Reducing Peak Current in Memory Systems" filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Agrell et al., "Closest Point Search in Lattices", IEEE Transactions on Information Theory, vol. 48, No. 8, pp. 2201-2214, Aug. 2002.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ISSCA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.
Horstein, "On the Design of Signals for Sequential and Nonsequential Detection Systems with Feedback," IEEE Transactions on Information Theory IT-12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference , New Orleans, Louisiana. 155-164.
Lee et al., "Effects of Floating Gate Interference on NAND Flash Memory Cell Operation", IEEE Electron Device Letters, vol. 23, No. 5, pp. 264-266, May 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Sommer, N., U.S. Appl. No. 12/171,797 "Memory Device with Non-Uniform Programming Levels" filed Jul. 11, 2008.

U.S. Appl. No. 11/949,135 Official Action dated Oct. 2, 2009.

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

Berman et al., "Mitigating Inter-Cell Coupling Effects in MLC NAND Flash via Constrained Coding", Flash Memory Summit, Santa Clara, USA, Aug. 19, 2010.

CM Patent Application # 200780026181.3 Official Action dated Apr. 8, 2011.

Bez et al., "Introduction to Flash Memory," Proceedings of the IEEE, vol. 91, No. 4, Apr. 2003, pp. 489-502.

Eitan et al., "Multilevel Flash Cells and their Trade-Offs," Proceedings of the 1996 IEEE International Electron Devices Meeting (IEDM), New York, NY pp. 169-172.

Eitan, et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.

Maayan et al., "A 512 Mb NROM Flash Data Storage Memory with 8 MB/s Data Rate", Proceedings of the 2002 IEEE International Solid-State Circuits Conference (ISSCC 2002), San Francisco, California, Feb. 3-7, 2002, pp. 100-101.

Kim et al., "Future Memory Technology including Emerging New Memories," Proceedings of the 24th International Conference on Microelectronics (MIEL), Nis, Serbia and Montenegro, May 16-19, 2004, vol. 1, pp. 377-384.

Wei, L., "Trellis-Coded Modulation With Multidimensional Constellations", IEEE Transactions on Information Theory, vol. IT-33, No. 4, pp. 483-501, Jul. 1987.

U.S. Appl. No. 13/114,049 Official Action dated Sep. 12, 2011.

U.S. Appl. No. 12/405,275 Official Action dated Jul. 29, 2011.

US 7,161,836, 01/2007, Wan et al. (withdrawn)

* cited by examiner

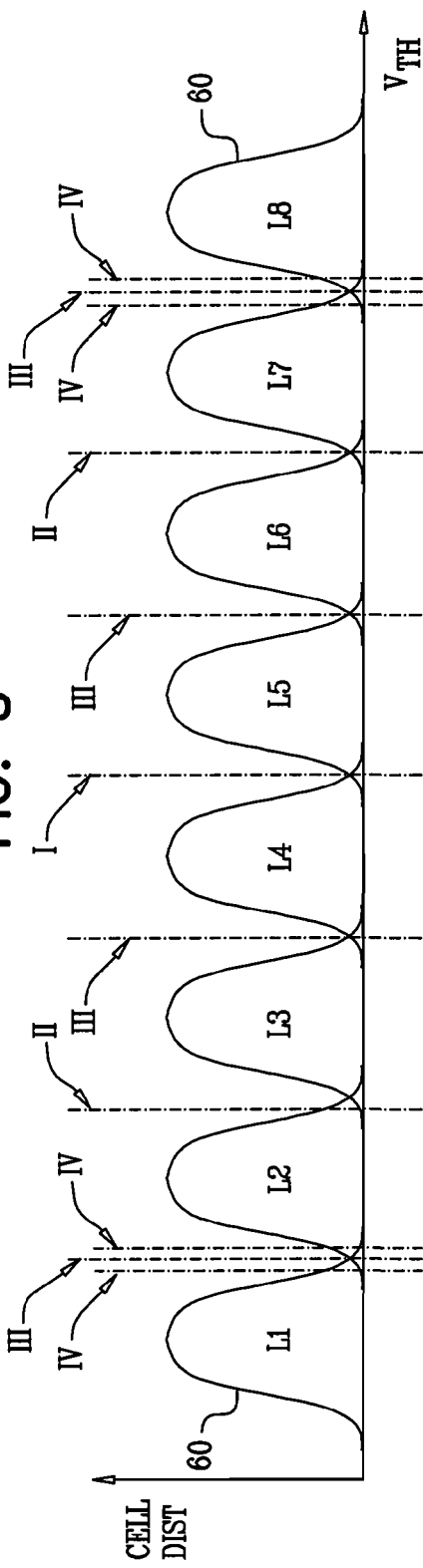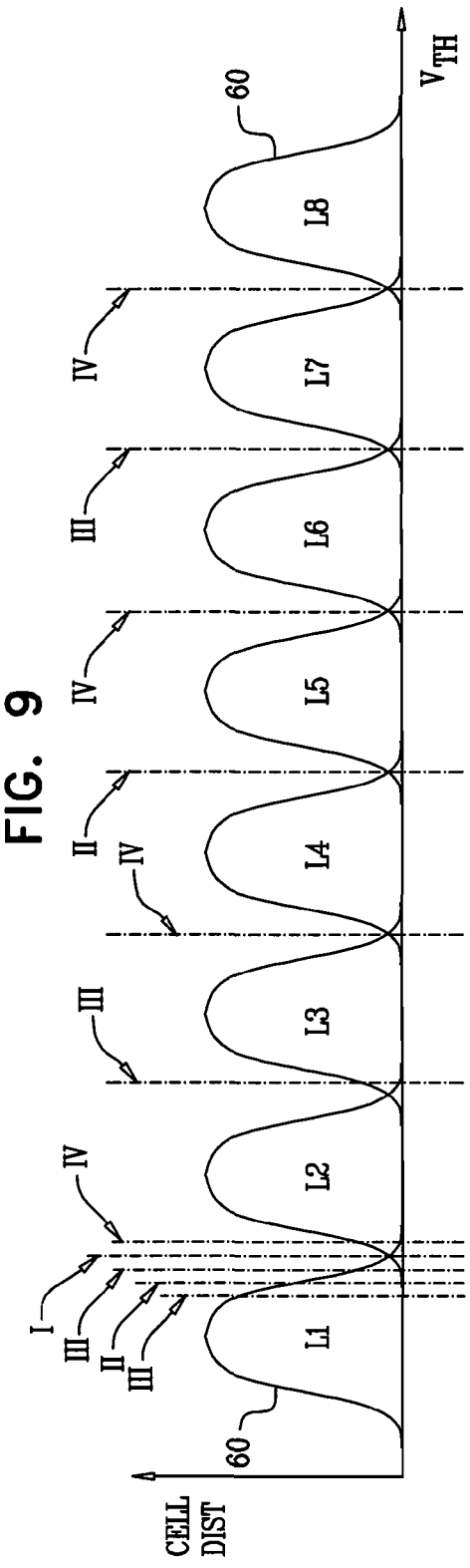

READING ANALOG MEMORY CELLS USING BUILT-IN MULTI-THRESHOLD COMMANDS

CROSS-REFERENCE TO RELATED APPLICATIONS

This application claims the benefit of U.S. Provisional Patent Application 60/981,113, filed Oct. 19, 2007, and U.S. Provisional Patent Application 60/989,129, filed Nov. 20, 2007, whose disclosures are incorporated herein by reference.

FIELD OF THE INVENTION

The present invention relates generally to memory devices, and particularly to methods and systems for retrieving data from multi-level analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible storage values is typically divided into regions, each region corresponding to one or more data bit values. Data is written to an analog memory cell by writing a nominal storage value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Analog memory cells are commonly read by comparing their storage values to one or more read thresholds. Some known methods and systems read analog memory cells using multiple read thresholds. For example, PCT International Publication WO 2007/132457, whose disclosure is incorporated herein by reference, describes a method for operating a memory device. The method includes encoding data using an Error Correction Code (ECC) and storing the encoded data as first analog values in respective analog memory cells of the memory device. Second analog values are then read from the respective memory cells. A distortion present in the second analog values is estimated, and error correction metrics are computed responsively to the estimated distortion. The second analog values are processed using the error correction metrics in an ECC decoding process, so as to reconstruct the data. In some embodiments, the error correction metrics are computed by combining multiple instances of the second storage values, which are obtained by using respective different sets of read thresholds.

PCT International Publication WO 2008/053472, whose disclosure is incorporated herein by reference, describes a method for operating a memory. The method includes storing data, which is encoded with an ECC, in analog memory cells of the memory by writing respective analog input values selected from a set of nominal values to the analog memory cells. The stored data is read by performing multiple read operations that compare analog output values of the analog memory cells to different, respective read thresholds. At least two of the read thresholds are positioned between a pair of the nominal values that are adjacent to one another in the set of the nominal values.

The two PCT Publications cited above are assigned to the assignee of the present patent application and were published after the priority date of the present patent application.

SUMMARY OF THE INVENTION

An embodiment of the present invention provides a method for data storage, including:

storing data in a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and after storing the data, reading the first data bits from the memory cells by executing at least the second built-in command.

In some embodiments, reading the first data bits by executing at least the second built-in command includes reading multiple instances of the first data bits using the respective second thresholds. In an embodiment, the multiple instances of the first data bits are processed so as to adjust the first thresholds. Additionally or alternatively, the multiple instances of the first data bits are processed so as to cancel interference in the analog memory cells. Further additionally or alternatively, storing the data includes encoding the data with an Error Correction Code (ECC), and the method includes processing the multiple instances of the first data bits so as to compute soft decoding metrics for decoding the ECC.

In a disclosed embodiment, reading the first data bits by executing at least the second built-in command includes making an attempt to read the first data bits using the first built-in command, and reverting to read the first data bits using the second built-in command responsively to a failure of the attempt.

In another embodiment, each of the analog memory cells further stores a third data bit, the memory has a third built-in command for reading the third data bits of the memory cells by comparing the storage values of the memory cells to a third number of third thresholds, such that the third number is larger than the second number, and reading the first data bits includes executing both the second and the third built-in commands.

In yet another embodiment, storing the data includes writing to the memory cells nominal storage values selected from a group of possible nominal storage values corresponding to the respective programming levels, and executing at least the second built-in command includes positioning the second thresholds between a pair of the nominal storage values that are adjacent to one another in the group of the possible nominal storage values. In still another embodiment, the storage values of the memory cells that assume a given programming level are distributed over a range, and executing at least the second built-in command includes positioning at least one of the second thresholds within the range. In an embodiment, the second built-in command reads the second data bits independently of the first data bits.

There is additionally provided, in accordance with an embodiment of the present invention, a method for data storage, including:

storing data in a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and after storing the data, reading the first data bits from the memory cells by executing at least the second built-in command.

There is also provided, in accordance with an embodiment of the present invention, apparatus for data storage, including:

an interface, which is operative to communicate with a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and a processor, which is coupled to store data in the memory cells and, after storing the data, to read the first data bits from the memory cells by executing at least the second built-in command.

There is further provided, in accordance with an embodiment of the present invention, apparatus for data storage, including:

a memory including multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and a processor, which is coupled to store data in the memory cells and, after storing the data, to read the first data bits from the memory cells by executing at least the second built-in command.

There is additionally provided, in accordance with an embodiment of the present invention, apparatus for data storage, including:

an interface, which is operative to communicate with a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and a processor, which is coupled to store data in the memory cells and, after storing the data, to read the first data bits from the memory cells by executing at least the second built-in command.

There is also provided, in accordance with an embodiment of the present invention, apparatus for data storage, including:

a memory including multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and a processor, which is coupled to store data in the memory cells and, after storing the data, to read the first data bits from the memory cells by executing at least the second built-in command.

The present invention will be more fully understood from the following detailed description of the embodiments thereof, taken together with the drawings in which:

BRIEF DESCRIPTION OF THE DRAWINGS

FIGS. 7-9 are graphs showing storage value distributions and read thresholds in a group of multi-level analog memory cells, in accordance with alternative embodiments of the present invention.

DETAILED DESCRIPTION OF EMBODIMENTS

Overview

Figure 1:
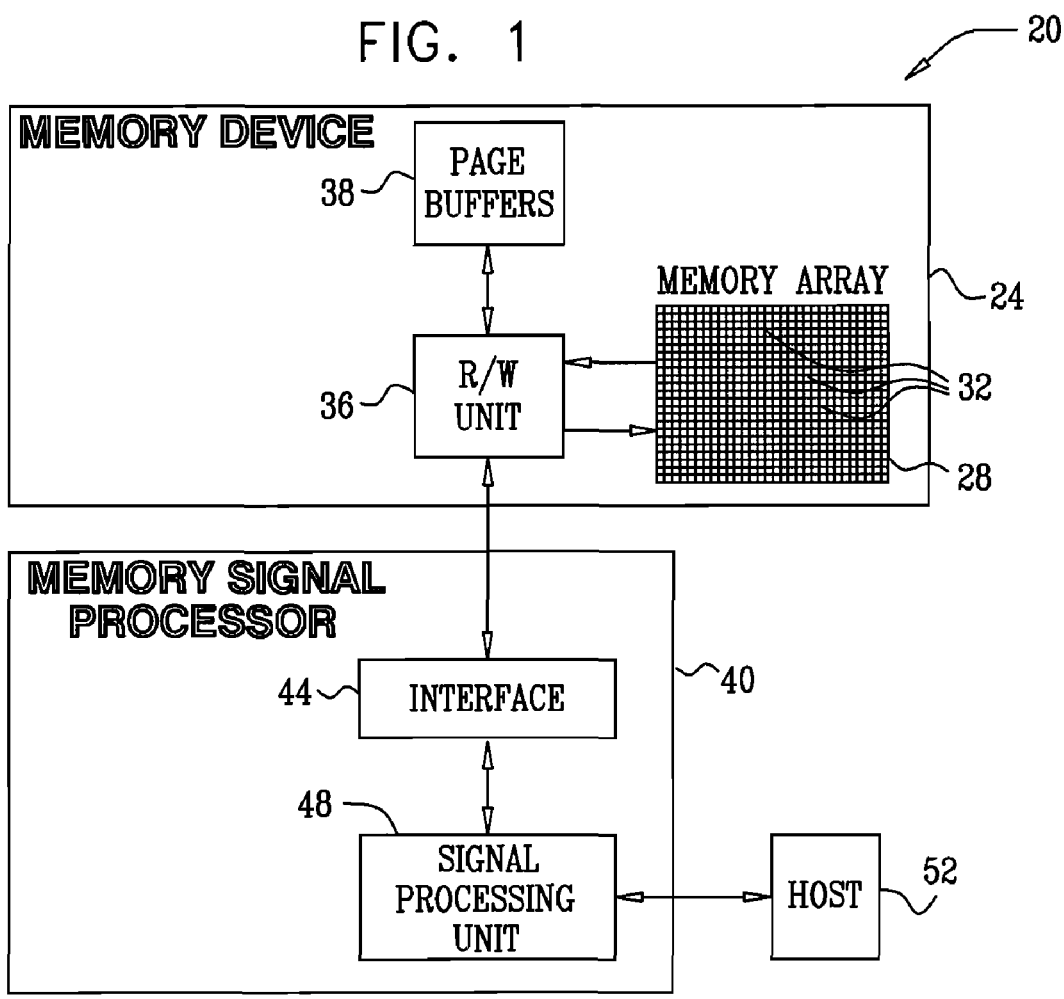
FIG. 1 is a block diagram that schematically illustrates a memory system, in accordance with an embodiment of the present invention.

In many MLC device configurations, different bits are read from the memory cells using respective, different sets of read thresholds. For example, in an eight-level MLC configuration, each memory cell stores three bits, which are referred to as a Least Significant Bit (LSB), a Central Significance Bit (CSB) and a Most Significant Bit (MSB). In a common reading scheme, the LSB is read using a single threshold, the CSB is read using a set of two thresholds, and the MSB is read using a different set that includes four thresholds.

Some MLC devices support composite built-in read commands for reading a certain bit from a group of memory cells. For example, in the 3 bits/cell configuration described above, the memory device may support three built-in commands (e.g., "read the LSBs from the group of cells X," "read the CSBs from the group of cells X," and "read the MSBs from the group of cells X,"). Typically, the threshold values to be used by the memory device are specified in the command. In response to receiving one of these commands, the memory device automatically sets the appropriate read thresholds for reading the requested bit, performs the appropriate threshold comparison operations and outputs the read results.

When using such built-in commands, the entire operation sequence for reading a given bit (which often involves multiple read operations that use multiple thresholds) is triggered by a single instruction. Thus, the use of built-in commands reduces the memory access overhead and the communication throughput to and from the memory device, in comparison with single-threshold read commands.

In various situations and applications, there is a need to re-read a given bit in a group of memory cells multiple times using multiple different thresholds. Reading a given bit using different thresholds may be carried out, for example, in order to adjust or optimize the read threshold values, in order to estimate and cancel interference and/or in order to compute soft metrics for decoding an Error Correction Code (ECC) that encodes the data. Embodiments of the present invention that are described hereinbelow provide highly-efficient methods and systems for re-reading analog memory cells using different thresholds, by utilizing built-in multiple-threshold commands supported by the memory device.

In some embodiments, a Memory Signal Processor (MSP) stores data in a memory device, which comprises an array of multi-bit analog memory cells. The memory device supports one or more built-in read commands for reading respective data bits from the cells. Each built-in read command uses a respective set of one or more read thresholds.

In order to read a given bit using multiple thresholds, the MSP sends the memory device a built-in read command specifying the desired multiple thresholds. The memory device executes the command, and thus re-reads the given bit using the desired multiple thresholds. Using this technique, the MSP re-reads a given bit multiple times by issuing only a single instruction, rather than using multiple single-threshold commands. As a result, the number of memory access operations performed by the MSP and the data throughput over the interface between the memory device and the MSP are reduced considerably. Typically, the re-reading functionality is transparent to the memory device and may be applied to legacy memory devices.

In some embodiments, the command issued for re-reading a given bit has a number of thresholds that is higher than the number of thresholds normally used for reading this bit. For example, the memory device typically comprises a built-in command that is predefined for reading the LSB using a single threshold. When using the disclosed methods, the LSB can be read four times from a group of cells by (1) issuing a built-in read command that is predefined for reading the MSB, and (2) specifying the four desired re-reading thresholds in the command.

In some embodiments, the MSP initially reads a given bit using the built-in command that is predefined for reading this bit, and reverts to a built-in command having a higher number of thresholds if the initial reading attempt fails. In some embodiments, the multiple thresholds used for re-reading are positioned between adjacent programming levels. Alternatively, one or more of the thresholds can be positioned within a storage value interval that is occupied by a programming level. This sort of threshold setting is useful, for example, for obtaining statistical information regarding the storage value distribution.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 comprise Multi-Level Cells (MLC, also referred to as multi-bit cells), each storing multiple data bits.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. Memory device 24 comprises one or more page buffers 38, which are used for caching data pages during data storage and retrieval.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device. In some embodiments, unit 48 encodes the data for storage using an Error Correction Code (ECC) or Error Detection Code (EDC), and decodes the ECC or EDC of the data retrieved from the memory.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

In a typical configuration, memory cells 32 of array 28 are arranged in a grid having multiple rows and columns, commonly referred to as word lines and bit lines, respectively. The array is typically partitioned into multiple pages, i.e., groups of memory cells that are programmed and read simultaneously. Word lines are typically erased in blocks, referred to as erasure blocks, which are erased simultaneously.

The storage values read from memory cells 32 often vary from the nominal values, such as because of programming inaccuracies, reading inaccuracies and various distortion mechanisms. Thus, the storage values of the cells in a given programming level are distributed over a certain range in accordance with a certain statistical distribution. Typically, R/W unit 36 reads data from cells 32 by comparing the storage values of the cells to one or more read thresholds, in order to determine the programming level assumed by each cell. Such read operations are applied simultaneously to a group of memory cells within a certain word line.

Memory cells 32 comprise Multi-Level Cells (MLC), with each cell 32 storing two or more bits of data. For N bits/cell memory cells, each programming level represents a certain combination of N bit values. Determining the programming level assumed by a given cell is therefore equivalent to decoding the N data bits stored in the cell.

Figure 2:
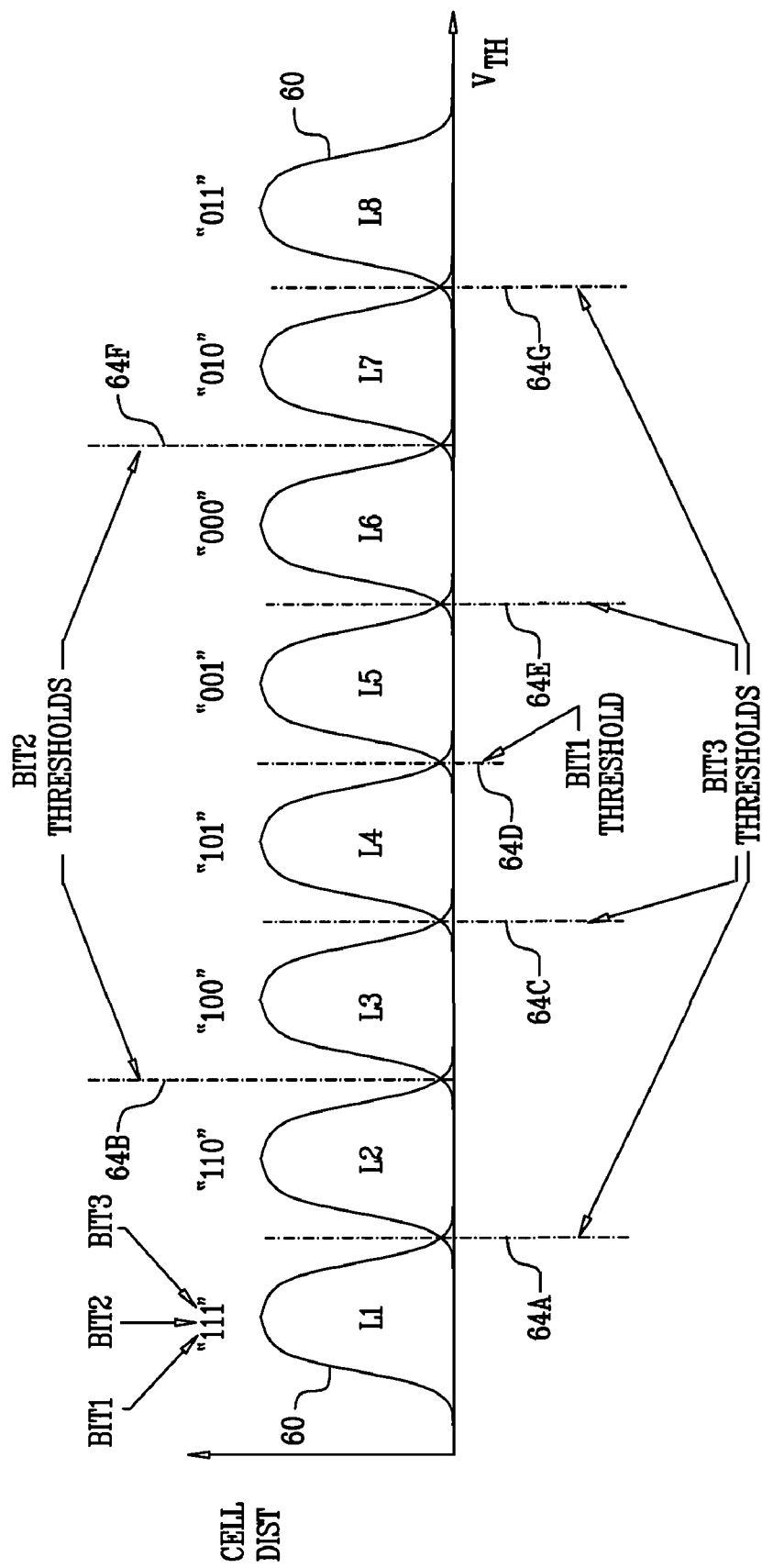
FIG. 2 is a graph showing storage value distributions and read thresholds in a group of multi-level analog memory cells, in accordance with an embodiment of the present invention.

FIG. 2 is a graph showing storage value distributions and read thresholds in a group of multi-level analog memory cells 32, in accordance with an embodiment of the present invention. The example of FIG. 2 refers to an array of eight-level multi-level cells, with each cell storing three bits of data. The eight programming levels are denoted L1 ... L8, and each level represents a unique combination of three bit values. For example, as marked in the figure, level L1 represents "111" data, level L2 represents "110" data, etc. In the notation used throughout this patent application, the left-most bit in the triplet is referred to as BIT1, the next bit is referred to as BIT2, and so on.

The storage values in each programming level are distributed in accordance with a certain statistical distribution 60. In some cases, such as when the level of distortion in the cells is particularly high, adjacent distributions 60 may overlap one another. R/W unit reads the data from the memory cells by comparing their storage values to a set of read thresholds 64A ... 64G.

Although the description that follows refers mainly to the eight-level cell configuration of FIG. 2, the methods and systems described herein can be used with any other suitable kind of memory cells (e.g., four-level or sixteen-level cells), with any other suitable mapping of bit combinations to programming levels, and with any other suitable threshold arrangement.

Built-In Multi-Threshold Read Commands

In some embodiments, R/W unit 36 reads each bit of memory cells 32 (e.g., BIT1, BIT2 and BIT3 in FIG. 2) using a certain subset of the read thresholds. In the configuration of FIG. 2, for example, BIT1 is read by comparing the storage values to threshold 64D. As can be seen in the figure, all programming levels whose storage values are lower than threshold 64D have BIT1="1", and all programming levels whose storage values are higher than this threshold have BIT1="0". BIT2 is read by comparing the storage values of the cells to two thresholds 64B and 64F. Storage values falling between the two thresholds indicate that BIT2="0", and storage values falling below threshold 64B or above threshold 64F indicate that BIT2="1". Similarly, BIT3 is read by comparing the storage values of the cells to four read thresholds 64A, 64C, 64E and 64G.

Some memory devices support built-in read commands for retrieving given bits from a group of memory cells. In such memory devices, the R/W unit automatically sets the appropriate read thresholds for reading the requested bit, performs the appropriate threshold comparison operations, processes the comparison results (interim read results) to determine the bit values of the cells, and sends the bit values (final read results) to the MSP or controller.

For example, in the configuration of FIGS. 1 and 2, memory device 24 supports three built-in read commands—a first command for reading BIT1 from a group of memory cells, a second command for reading BIT2 from a group of memory cells, and a third command for reading BIT3 from a group of cells. In order to retrieve a certain bit from a certain group of memory cells, the MSP (or other controller) sends one of these commands to memory device 24. In response to receiving the request, R/W unit 36 in memory device 24 sets the (one or more) thresholds associated with the requested bit, performs the appropriate comparison operations, processes the interim read results of each cell, and returns the final read results to the MSP. In the present example, each built-in command reads a certain bit (e.g., BIT1, BIT2 or BIT3) independently of other bits of the memory cells.

The use of such built-in read commands is advantageous over simpler commands that perform only a single threshold comparison since it (1) reduces the number of memory device access operations and (2) reduces the amount of data transferred from the memory device to the MSP considerably. For example, reading BIT3 from a group of 8192 cells using single-threshold read commands would cause 4.8192=32768 interim read results to be transferred to the MSP. The MSP would then process these 32768 results (four single-threshold read results for every cell), to produce the requested 8192 final read results. Using built-in multi-threshold read commands, on the other hand, the 32768 interim read results are obtained and processed internally to the memory device, and only the final 8192 read results are transferred to the MSP. Using single-threshold read commands, the memory device is accessed seven times. Using the built-in multi-threshold commands, on the other hand, the memory device is accessed only once.

Efficient Multi-Threshold Reading Schemes Using Built-In Read Commands

In various situations and applications, MSP 40 performs multiple re-read operations of a given bit in a group of memory cells, using multiple different thresholds. Embodiments of the present invention, which are explained and demonstrated below, provide methods and systems that perform such re-read operations efficiently, by utilizing the built-in multiple-threshold commands supported by the memory device.

MSP 40 may re-read a given bit (i.e., read multiple instances of the given bit) with different thresholds for various purposes. For example, distributions 60 may drift, widen or otherwise change over time, such as because of aging or interference. When distributions 60 change, the optimal positions of the read thresholds often change, as well. In some embodiments, the MSP re-reads a given bit using multiple thresholds, and processes the multiple read results of this bit to optimize the threshold positions. Such techniques are described, for example, in PCT International Publications WO 2007/132457 and WO 2008/053472, cited above.

As another example, the MSP may re-read a given bit in a group of memory cells with different thresholds in order to cancel cross-coupling interference from other cells. In some embodiments, the MSP selects the least-interfered read results on a cell-by-cell basis. Some cross-coupling cancellation methods, which use multiple read results that are obtained using multiple read thresholds, are described in PCT International Publications WO 2007/132457 and WO 2008/053472, cited above.

As yet another example, the MSP may employ an ECC scheme that uses soft decoding metrics. In these embodiments, the MSP computes soft metrics of a given bit in a group of memory cells, and decodes the ECC using the soft metrics. The MSP computes the soft metrics by re-reading the bits in question using multiple different thresholds, and processes the multiple read results to produce the metrics. Soft metric computation techniques of this sort are described, for example, in PCT International Publications WO 2007/132457 and WO 2008/053472, cited above.

Figure 3:
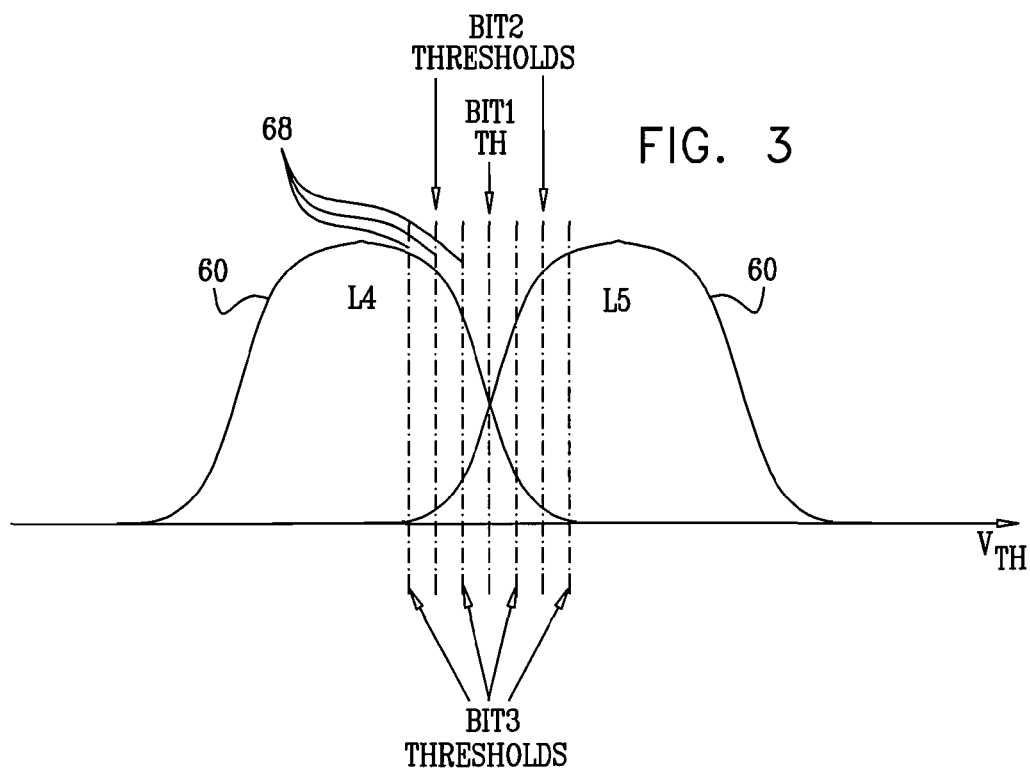
FIG. 3 is a graph showing read thresholds used for reading data from multi-level analog memory cells, in accordance with an embodiment of the present invention.

FIG. 3 is a graph showing read thresholds 68 used for reading data from multi-level analog memory cells 32, in accordance with an embodiment of the present invention. In the example of FIG. 3, system 20 performs re-read operations using a set of seven thresholds 68, which are positioned between programming levels L4 and L5. This scenario may occur, for example, when the MSP attempts to optimize the position of the read threshold that differentiates between levels L4 and L5, or when the MSP computes soft ECC decoding metrics.

In some embodiments, the MSP instructs R/W unit 36 to perform the seven re-read operations using the built-in multi-threshold read operations supported by the memory device. In the present example, the MSP sends three read commands to the memory device:

A BIT1 read command specifying a single threshold (denoted "BIT1 TH" in the figure).
A BIT2 read command specifying two thresholds (denoted "BIT2 THRESHOLDS" in the figure), one threshold on either side of the BIT1 threshold.
A BIT3 read command specifying four thresholds (denoted "BIT3 THRESHOLDS" in the figure), interleaved among the BIT1 and BIT2 thresholds.

By executing these three multi-threshold read commands, the R/W unit compares the storage values of the cells to seven thresholds and transfers three sets of read results to the MSP. The read results can be used by the MSP for adjusting threshold positions, for performing interference cancellation, for computing soft metrics or for any other purpose.

In the present example, the built-in commands supported by the memory device are predefined to read BIT1 using a single threshold, BIT2 using two thresholds and BIT3 using four thresholds. In the process described above, however, BIT1 is read using the built-in commands that are predefined for reading BIT2 and BIT3. These commands have a higher number of thresholds than the number that is predefined for reading BIT1.

In some embodiments, the values of the thresholds to be used are specified as part of the built-in read command. Alternatively, the values can be provided to the memory device in a separate command that is sent adjacently to the built-in read command, or using any other suitable means.

Figure 4:
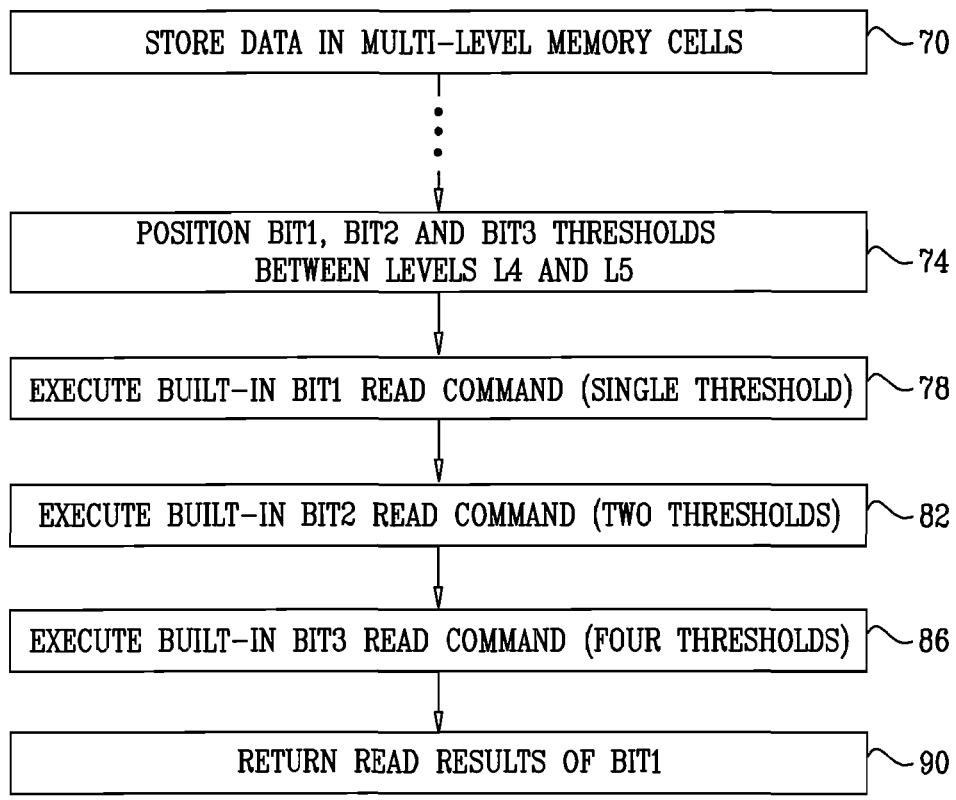
FIG. 4 is a flow chart that schematically illustrates a method for reading data from multi-level analog memory cells, in accordance with an embodiment of the present invention.

FIG. 4 is a flow chart that schematically illustrates the method described above for reading data from multi-level analog memory cells, in accordance with an embodiment of the present invention. The method begins with system 20 storing data in multi-level analog memory cells 32 of array 28, at a storage step 70. In the present example, cells 32 comprise eight-level (3 bits/cell) MLC, as shown in FIG. 2.

At some point in time, MSP 40 initiates a process of reading BIT1 from a group of memory cells 32 using multiple thresholds. The process may be initiated in order to adjust read threshold positions, in order to cancel cross-coupling interference, in order to compute soft metrics, or for any other reason.

The MSP sets the values of the read thresholds in the BIT1, BIT2 and BIT3 built-in read commands, at a threshold setting step 74. The MSP positions the seven thresholds to fall between programming levels L4 and L5, as shown in FIG. 3 above. The MSP sends the three commands to the memory device.

R/W unit 36 in memory device 24 executes the three commands. The R/W unit executes the BIT1 command at a first bit reading step 78, the BIT2 command at a second bit reading step 82, and the BIT3 command at a third bit reading step 86. The BIT1, BIT2 and BIT3 commands use one, two and four thresholds, respectively. Since, as noted above, each read command reads a given bit independently of the other bits, steps 78-86 can be executed in any order.

Device 24 sends the BIT1 read results produced by the three built-in read operations (which comprise results originating from seven thresholds) to the MSP, at a result reporting step 90. The MSP applies the desired processing (e.g., threshold adjustment, cross-coupling interference cancellation or soft metric computation) to the returned read results.

Increasing the Number of Thresholds in Response to Decoding Failure

In some embodiments, the MSP initially reads a given bit using the built-in command that is originally predefined for reading this bit, and reverts to a command having a higher number of thresholds if the initial reading attempt fails. The command that the MSP reverts to comprises a command that is originally predefined for reading another bit of the memory cells, and is referred to herein as an alternative command.

The MSP may use any suitable criteria for determining read failures, such as a failure to decode an ECC that decodes the retrieved data, an error indication of an EDC, an intolerable error level in the reconstructed data or a distortion level that exceeds a certain tolerable level.

In some embodiments, the MSP sets the thresholds of the alternative command to fall in the vicinity of the threshold used in the initial unsuccessful attempt. For example, the MSP may apply the method of FIGS. 3 and 4 above in a gradual manner. In this implementation, the MSP first reads BIT1 using the single "BIT1 TH" threshold. If the initial attempt fails, the MSP re-reads BIT1 using the BIT2 read command, specifying the two "BIT2 THRESHOLDS" shown in FIG. 3. If this attempt fails too, the MSP re-reads BIT1 once again using the four BIT3 thresholds. At all stages, the read thresholds are positioned between programming levels L4 and L5, as shown in FIG. 3.

In some embodiments, the MSP comprises logic (in hardware or software) for converting the read results of one built-in command to the format of another built-in command, so that the read results can be interpreted correctly. For example, when reading BIT1 using the BIT2 built-in command, the MSP may comprise logic for separating the read results of the BIT2 read command into two single-bit read results having two different thresholds, so as to appear to subsequent processes as read results of two BIT1 read commands.

As another example, the MSP may comprise logic that generates, in response to the read results of the BIT2 read command, a BIT1-equivalent stream having different thresholds for different cells. As noted above, using different thresholds for different cells is useful, for example, in interference cancellation processes. Alternatively, the MSP may carry out interference cancellation computations directly on the read results of the BIT1 and BIT2 built-in commands.

In some embodiments, one or more of the thresholds in the alternative command are set to fall in the vicinity of the initial threshold, while one or more other thresholds are set to fall in any other suitable region of the storage value axis. Unlike the previous example, in which the number of thresholds was increased to improve the reading performance of BIT1, in the present embodiment the added threshold or thresholds are used to sample the storage value distribution at an additional point. The additional thresholds may be positioned between programming levels and thus assist in subsequently reading other bits from the memory cells. Alternatively, the additional thresholds may be positioned within the distribution of a given programming level, and therefore improve the statistical information of the MSP regarding this distribution.

Figure 5:
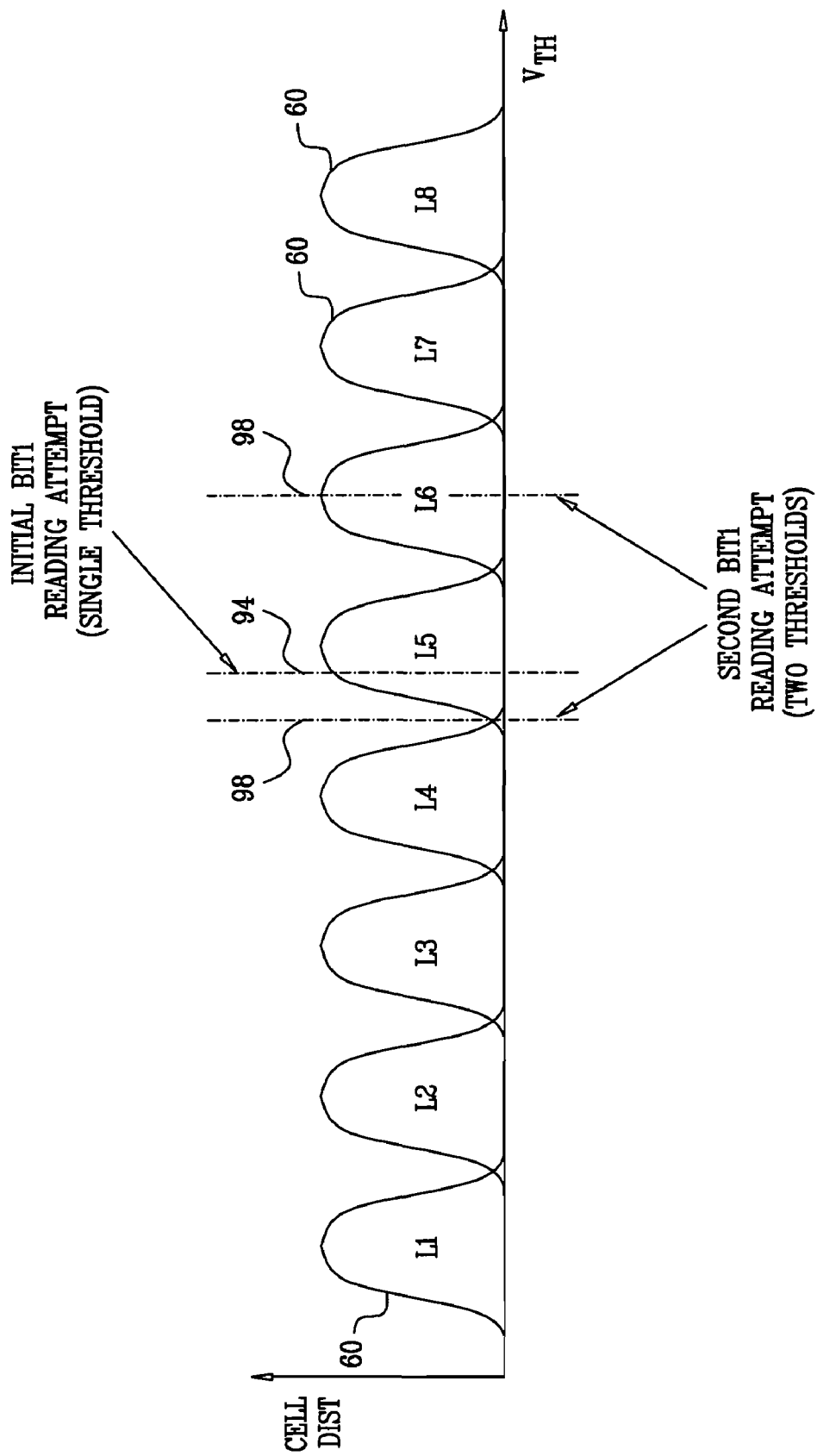
FIG. 5 is a graph showing storage value distributions and read thresholds in a group of multi-level analog memory cells, in accordance with another embodiment of the present invention.

FIG. 5 is a graph showing storage value distributions and read thresholds in a group of multi-level analog memory cells, in accordance with another embodiment of the present invention. In the present example, the MSP initially attempts to read BIT1 using the BIT1 read command. The initial read attempt uses an initial threshold 94. As can be seen in the figure, the initial threshold is not positioned properly, since it falls inside the distribution of level L5 instead of between levels L4 and L5. Therefore, this initial attempt is likely to fail.

Upon a failure of the initial attempt, the MSP makes a second attempt to read BIT1. In the second attempt, the MSP instructs the R/W unit to use the BIT2 read commands that compares the storage values of the cells to two thresholds 98. In the example of FIG. 5, one of thresholds 98 is set between levels L4 and L5 by correcting the non-optimal position of threshold 94. The second threshold 98 is set to the middle of the distribution of level L6. The MSP may use the read results corresponding to the second threshold for constructing histograms or other statistical functions of the storage values of the cells, for obtaining better resolution in future read operations, or for any other purpose.

Figure 6:
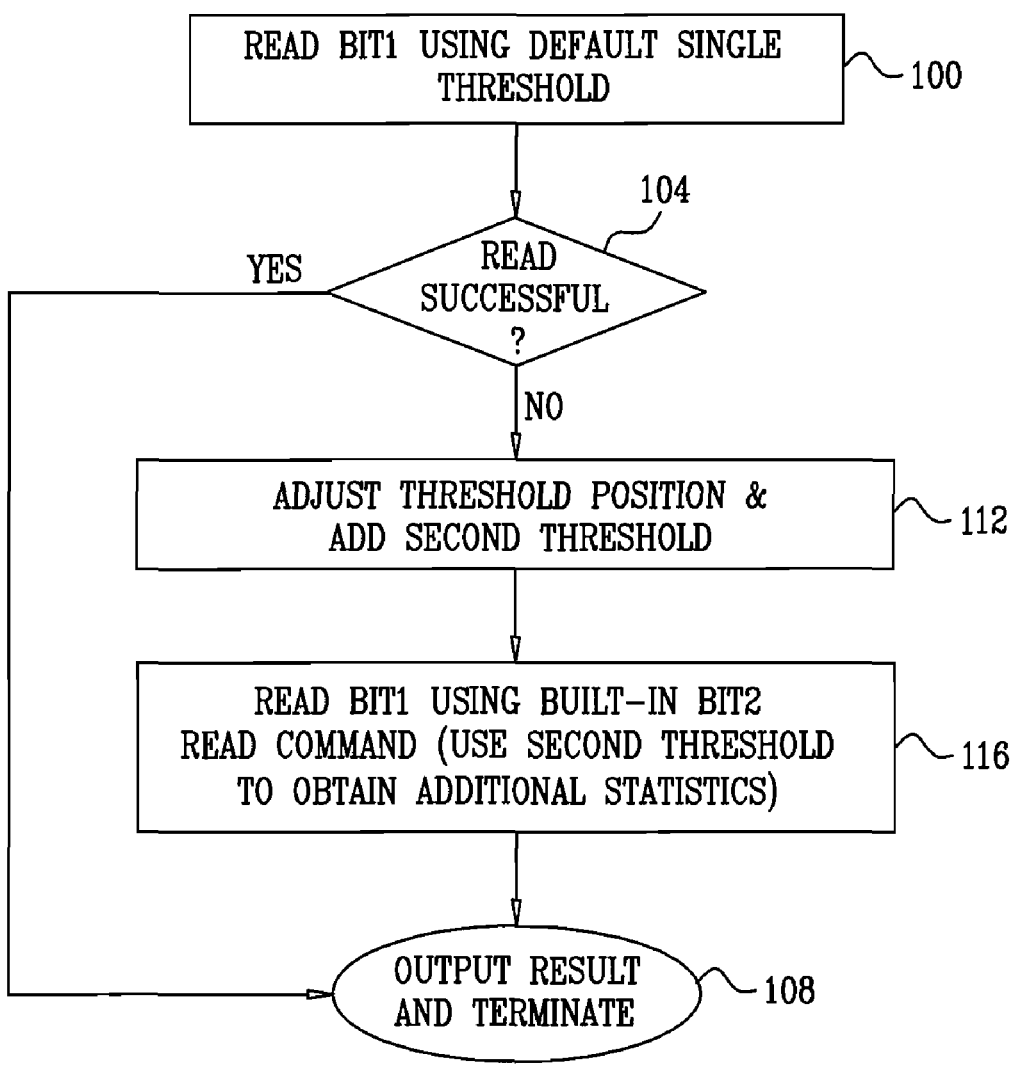
FIG. 6 is a flow chart that schematically illustrates a method for reading data from multi-level analog memory cells, in accordance with an embodiment of the present invention.

FIG. 6 is a flow chart that schematically illustrates a method for reading data from multi-level analog memory cells 32, in accordance with an embodiment of the present invention. The method demonstrates the features of (1) reading a given bit using a built-in command that is originally predefined for reading another bit, and (2) reverting to this built-in command only upon a failure in the default reading process.

The method of FIG. 6 begins with system 20 reading BIT1 from a group of memory cells 32 using a single threshold, at an initial reading step 100. Referring to FIG. 5 above, BIT1 is initially read using threshold 94 by executing the built-in BIT1 read command.

The MSP then checks whether the initial read attempt was successful, at a success checking step 104. As noted above, the success criterion may depend on successful ECC or EDC decoding, on distortion measurement or on any other factor. If the initial attempt was successful, the MSP reconstructs the read data, outputs the result and terminates, at a termination step 108.

Otherwise, i.e., if the initial read attempt failed, the system re-reads BIT1 using the built-in BIT2 read command. The MSP specifies two thresholds for this command, at a threshold setting step 112. The two thresholds comprise (1) a corrected or adjusted threshold for reading BIT1, and (2) a second threshold positioned within another distribution. The first threshold is used for re-reading BIT1, while the second threshold is used for improving the statistical knowledge of the MSP regarding the storage value distributions in the memory cells. Referring to FIG. 5, the built-in BIT2 read command uses thresholds 98.

The MSP sends the command to the memory device, and R/W unit 36 executes the command, at an execution step 116. The R/W unit sends the read results to the MSP. The MSP reconstructs the data, outputs the result and terminates at step 108.

Additional Examples

The principles of the present invention can be used to define and execute various sequences of read operations that use the built-in read commands supported by the memory device. Such read sequences may improve the reading speed and/or quality under different scenarios.

Figure 7:
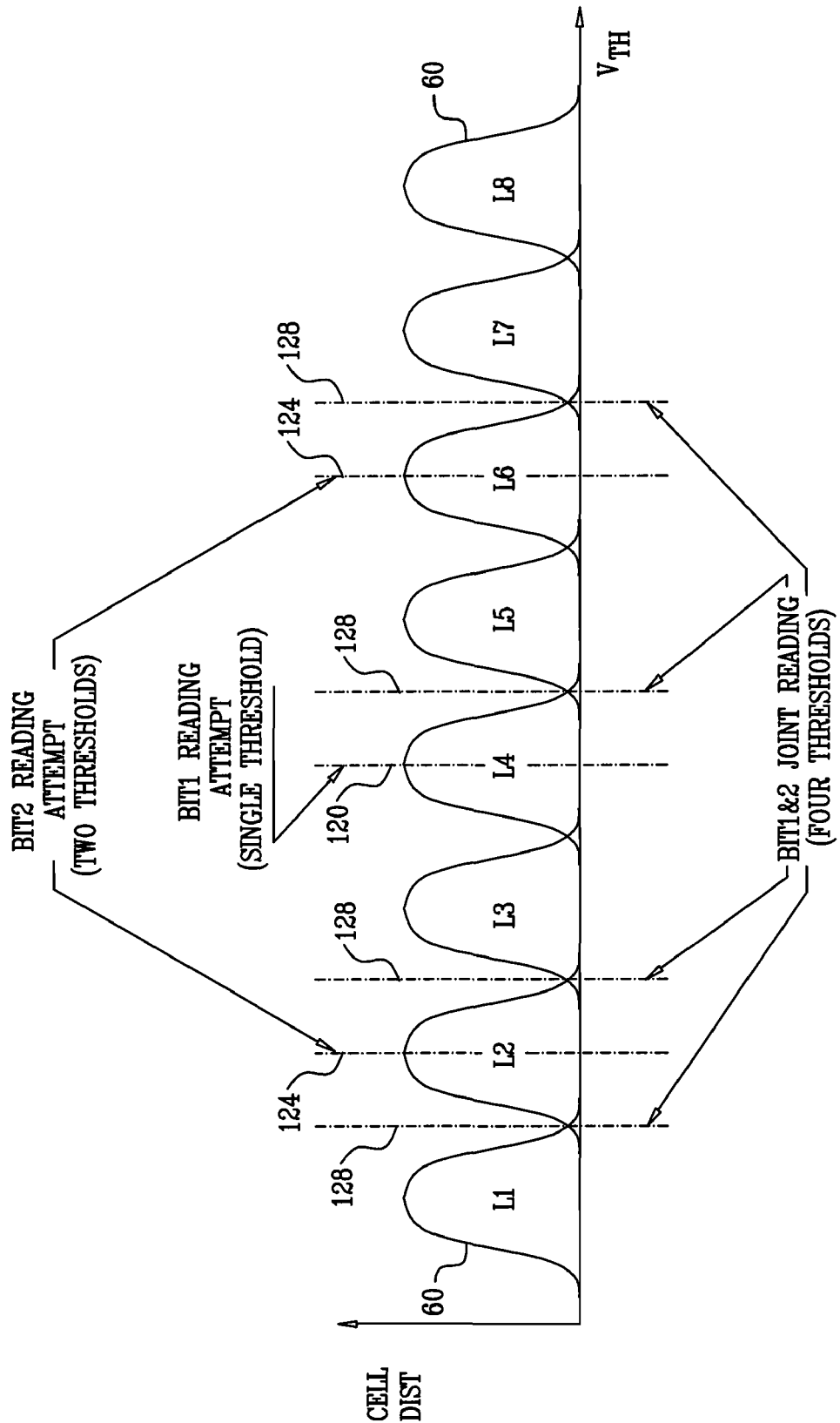

FIG. 7 is a graph showing storage value distributions and read thresholds in a group of multi-level analog memory cells, in accordance with yet another embodiment of the present invention. In the present example, the MSP initially reads BIT1 using a single threshold 120, by sending the built-in BIT1 read command to the memory device. As can be seen in the figure, threshold 120 is positioned incorrectly, and therefore the initial read attempt is likely to fail. In a second read operation, the MSP reads BIT2 using the built-in BIT2 read command, which uses two thresholds 124. In this case too, thresholds 124 are positioned incorrectly and the read attempt fails.

In response to the two failures, the MSP makes a third attempt to read both BIT1 and BIT2 by issuing a single BIT3 read command, which uses four thresholds 128. Thresholds 128 are positioned so that the results of the BIT3 command, when combined with the results of the failed BIT1 and BIT2 commands, enable successful decoding of BIT1 and BIT2. This scheme is thus able to decode BIT1 and BIT2 after a failure by issuing only a single additional read command. In comparison with known methods, this scheme provides smaller read latency and less communication throughput between the MSP and the memory device.

FIG. 8 is a graph showing storage value distributions and read thresholds in a group of multi-level analog memory cells, in accordance with another embodiment of the present invention. The example of FIG. 8 demonstrates a scenario in which BIT1 and BIT2 are read successfully using the respective predefined commands. Reading of BIT3, on the other hand, fails. The single threshold used for reading BIT1 is denoted "I" in the figure. The two thresholds used for reading BIT2 are denoted "II", and the four thresholds used for reading BIT3 are denoted "III". The failure in reading BIT3 in this example is caused by the left-most threshold of the BIT3 read command, i.e., the "III" threshold between levels L1 and L2.

In order to adjust this ill-positioned threshold and successfully read BIT3, the MSP carries out a fourth read attempt. The MSP sends another BIT3 read command, this time with four thresholds denoted "IV" in the figure. Two thresholds of the new command are positioned around the failed threshold. Thus, the thresholds of the BIT3 read commands can be adjusted using the additional information obtained by the fourth read attempt.

FIG. 9 is a graph showing storage value distributions and read thresholds in a group of multi-level analog memory cells, in accordance with yet another embodiment of the present invention. The example of FIG. 9 shows a scenario in which the MSP reads BIT1 . . . BIT3 using a sequence of four read commands. The first command comprises a single-threshold command with a threshold denoted "I". The second command comprises a dual-threshold command with thresholds denoted "II". The third command comprises a four-threshold command with thresholds denoted "III". The fourth command comprises another four-threshold command with thresholds denoted "IV".

In this example, it is known a-priori that the left-most threshold used for reading BIT3 (the threshold between levels L1 and L2) is ill-positioned or unknown. Consequently, the entire read sequence is designed a-priori to provide additional resolution in the vicinity of this threshold. The combined results of the four read attempts enable successful decoding of BIT1 . . . BIT3, regardless of the actual optimal position of the left-most threshold.

Although the embodiments described herein mainly address read operations in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
    storing data in a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and
    after storing the data, reading the first data bits from the memory cells by executing at least the second built-in command,
    wherein reading the first data bits by executing at least the second built-in command comprises reading multiple instances of the first data bits using the respective second thresholds.

2. The method according to claim 1, and comprising processing the multiple instances of the first data bits so as to adjust the first thresholds.

3. The method according to claim 1, and comprising processing the multiple instances of the first data bits so as to cancel interference in the analog memory cells.

4. The method according to claim 1, wherein storing the data comprises encoding the data with an Error Correction Code (ECC), and comprising processing the multiple instances of the first data bits so as to compute soft decoding metrics for decoding the ECC.

5. A method for data storage, comprising:
storing data in a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and
after storing the data, reading the first data bits from the memory cells by executing at least the second built-in command,
wherein reading the first data bits by executing at least the second built-in command comprises making an attempt to read the first data bits using the first built-in command, and reverting to read the first data bits using the second built-in command responsively to a failure of the attempt.

6. The method according to claim 1, wherein each of the analog memory cells further stores a third data bit, wherein the memory has a third built-in command for reading the third data bits of the memory cells by comparing the storage values of the memory cells to a third number of third thresholds, such that the third number is larger than the second number, and wherein reading the first data bits comprises executing both the second and the third built-in commands.

7. The method according to claim 1, wherein storing the data comprises writing to the memory cells nominal storage values selected from a group of possible nominal storage values corresponding to the respective programming levels, and wherein executing at least the second built-in command comprises positioning the second thresholds between a pair of the nominal storage values that are adjacent to one another in the group of the possible nominal storage values.

8. The method according to claim 1, wherein the storage values of the memory cells that assume a given programming level are distributed over a range, and wherein executing at least the second built-in command comprises positioning at least one of the second thresholds within the range.

9. The method according to claim 1, wherein the second built-in command reads the second data bits independently of the first data bits.

10. A method for data storage, comprising:
storing data in a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and
after storing the data, reading the first data bits from the memory cells by executing at least the second built-in command,
wherein reading the first data bits by executing at least the second built-in command comprises reading multiple instances of the first data bits using the respective second thresholds.

11. Apparatus for data storage, comprising:
an interface, which is operative to communicate with a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and
a processor, which is coupled to store data in the memory cells and, after storing the data, to read the first data bits from the memory cells by executing at least the second built-in command,
wherein the processor is coupled to read multiple instances of the first data bits using the respective second thresholds by executing at least the second built-in command.

12. The apparatus according to claim 11, wherein the processor is coupled to process the multiple instances of the first data bits so as to adjust the first thresholds.

13. The apparatus according to claim 11, wherein the processor is coupled to process the multiple instances of the first data bits so as to cancel interference in the analog memory cells.

14. The apparatus according to claim 11, wherein the processor is coupled to encode the stored data with an Error Correction Code (ECC), and to process the multiple instances of the first data bits so as to compute soft decoding metrics for decoding the ECC.

15. Apparatus for data storage, comprising:
an interface, which is operative to communicate with a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and
a processor, which is coupled to store data in the memory cells and, after storing the data, to read the first data bits from the memory cells by executing at least the second built-in command,
wherein the processor is coupled to make an attempt to read the first data bits using the first built-in command, and to revert to read the first data bits using the second built-in command responsively to a failure of the attempt.

16. The apparatus according to claim 11, wherein each of the analog memory cells further stores a third data bit, wherein the memory has a third built-in command for reading the third data bits of the memory cells by comparing the storage values of the memory cells to a third number of third thresholds, such that the third number is larger than the second number, and wherein the processor is coupled to read the first data bits by executing both the second and the third built-in commands.

17. The apparatus according to claim 11, wherein the processor is coupled to store the data by writing to the memory cells nominal storage values selected from a group of possible nominal storage values corresponding to the respective programming levels, and to position the second thresholds, which are used in executing the second built-in command, between a pair of the nominal storage values that are adjacent to one another in the group of the possible nominal storage values.

18. The apparatus according to claim 11, wherein the storage values of the memory cells that assume a given programming level are distributed over a range, and wherein the processor is coupled to position at least one of the second thresholds, which are used in executing the second built-in command, within the range.

19. The apparatus according to claim 11, wherein the second built-in command reads the second data bits independently of the first data bits.

20. Apparatus for data storage, comprising:
a memory comprising multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to a first number of first thresholds, and a second built-in command for reading the second data bits of the memory cells by comparing the storage values of the memory cells to a second number of second thresholds, such that the first number is less than the second number; and
a processor, which is coupled to store data in the memory cells and, after storing the data, to read the first data bits from the memory cells by executing at least the second built-in command,
wherein the processor is coupled to read multiple instances of the first data bits using the respective second thresholds by executing at least the second built-in command.

21. Apparatus for data storage, comprising:
an interface, which is operative to communicate with a memory that includes multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and
a processor, which is coupled to store data in the memory cells and, after storing the data, to read the first data bits from the memory cells by executing at least the second built-in command,
wherein the processor is coupled to read multiple instances of the first data bits using the respective second thresholds by executing at least the second built-in command.

22. Apparatus for data storage, comprising:
a memory comprising multi-bit analog memory cells, each of which stores at least first and second data bits by assuming one of a predefined plurality of programming levels associated with respective storage values, the memory having at least a first built-in command for reading the first data bits of the memory cells by comparing the storage values of the memory cells to one or more first thresholds, and a second built-in command for reading the second data bits of the memory cells independently of the first data bits by comparing the storage values of the memory cells to a plurality of second thresholds; and
a processor, which is coupled to store data in the memory cells and, after storing the data, to read the first data bits from the memory cells by executing at least the second built-in command,
wherein the processor is coupled to read multiple instances of the first data bits using the respective second thresholds by executing at least the second built-in command.

23. A method for data storage, comprising:
storing data in a memory that includes analog memory cells, each of which stores one or more data bits by assuming one of a predefined plurality of programming levels associated with respective storage values, such that the data is readable from the memory cells by comparing the storage values to a first number of thresholds; and
after storing the data, issuing to the memory a single read command, which causes the memory to compare the storage values to a second number of thresholds, larger than the first number,
wherein issuing the single read command comprises causing the memory to read multiple instances of each of the data bits.

24. The method according to claim 23, wherein storing the data comprises encoding the data with an Error Correction Code (ECC), and comprising processing the read multiple instances of the data bits so as to compute soft decoding metrics for decoding the ECC.

25. Apparatus for data storage, comprising:
an interface, which is operative to communicate with a memory that includes analog memory cells, each of which stores one or more data bits by assuming one of a predefined plurality of programming levels associated with respective storage values, such that the data is readable from the memory cells by comparing the storage values to a first number of thresholds; and
a processor, which is configured to store data in the memory cells, and, after storing the data, to issue to the memory a single read command, which causes the memory to compare the storage values to a second number of thresholds, larger than the first number,
wherein the single read command causes the memory to read multiple instances of each of the data bits.

26. The apparatus according to claim 25, wherein the processor is configured to encode the stored data with an Error Correction Code (ECC), and to process the read multiple instances of the data bits so as to compute soft decoding metrics for decoding the ECC.

* * * * *